(12) United States Patent
Takata et al.

(10) Patent No.: US 8,044,582 B2
(45) Date of Patent: Oct. 25, 2011

(54) ORGANIC DISPLAY APPARATUS COMPRISING MOISTURE PROPAGATION PREVENTING MEANS

(75) Inventors: Kenji Takata, Kawasaki (JP); Toshihiko Mimura, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 319 days.

(21) Appl. No.: 12/307,947

(22) PCT Filed: Jul. 13, 2007

(86) PCT No.: PCT/JP2007/064380
§ 371 (c)(1),
(2), (4) Date: Jan. 8, 2009

(87) PCT Pub. No.: WO2008/010582
PCT Pub. Date: Jan. 24, 2008

(65) Prior Publication Data
US 2009/0309489 A1   Dec. 17, 2009

(30) Foreign Application Priority Data

Jul. 19, 2006 (JP) .................................. 2006-196430
Jun. 25, 2007 (JP) .................................. 2007-165844

(51) Int. Cl.
*H01L 51/00* (2006.01)
*H01L 51/50* (2006.01)
*H01L 51/52* (2006.01)

(52) U.S. Cl. .......................... 313/509; 313/500; 313/506
(58) Field of Classification Search ........... 313/498–512
See application file for complete search history.

(56) References Cited

U.S. PATENT DOCUMENTS

| | | | |
|---|---|---|---|
| 6,784,459 B2 * | 8/2004 | Seki et al. ....................... | 257/88 |
| 6,933,671 B2 * | 8/2005 | Nakanishi ...................... | 313/500 |
| 7,053,549 B2 | 5/2006 | Omura et al. .................. | 313/512 |
| 7,230,593 B2 * | 6/2007 | Nakanishi ........................ | 345/80 |
| 7,304,437 B2 * | 12/2007 | Matsueda .................. | 315/169.3 |
| 7,432,529 B2 * | 10/2008 | Yamazaki et al. ............... | 257/72 |
| 7,723,179 B2 * | 5/2010 | Yamazaki et al. ............ | 438/233 |
| 2002/0024096 A1 * | 2/2002 | Yamazaki et al. .............. | 257/359 |
| 2005/0023964 A1 | 2/2005 | Omura et al. ................. | 313/504 |
| 2005/0029513 A1 * | 2/2005 | Kawashima et al. ........... | 257/40 |

(Continued)

FOREIGN PATENT DOCUMENTS

JP    2004-335267    11/2004

(Continued)

OTHER PUBLICATIONS

International Preliminary Report on Patentability issued Jan. 20, 2009 in International Application No. PCT/JP 2007/064380.

*Primary Examiner* — Nimeshkumar D. Patel
*Assistant Examiner* — Jose M Diaz
(74) *Attorney, Agent, or Firm* — Fitzpatrick, Cella, Harper & Scinto

(57) ABSTRACT

Provided is a display apparatus including: a substrate; plural thin film transistors formed on the substrate; a planarizing layer covering the plural thin film transistors; plural organic light emitting devices formed on the planarizing layer to form a display area; and plural nondisplay devices formed on the planarizing layer outside the display area. The organic light emitting devices each have a first electrode, an organic compound layer, and a second electrode on the substrate in the stated order. In the display apparatus, in each of the plural nondisplay devices, the discontinuous part of the planarizing layer is formed.

12 Claims, 5 Drawing Sheets

U.S. PATENT DOCUMENTS

| | | | |
|---|---|---|---|
| 2005/0046346 A1* | 3/2005 | Tsuchiya et al. | 313/509 |
| 2005/0218396 A1* | 10/2005 | Tsuchiya et al. | 257/13 |
| 2008/0150421 A1 | 6/2008 | Takata | 313/504 |
| 2009/0009069 A1 | 1/2009 | Takata | 313/504 |
| 2009/0033215 A1* | 2/2009 | Horikiri et al. | 313/504 |

FOREIGN PATENT DOCUMENTS

| | | |
|---|---|---|
| JP | 2005-164818 | 6/2005 |
| JP | 2006-018085 | 1/2006 |
| JP | 2006-058751 | 3/2006 |
| JP | 2006-066206 | 3/2006 |

* cited by examiner

ORGANIC DISPLAY APPARATUS COMPRISING MOISTURE PROPAGATION PREVENTING MEANS

TECHNICAL FIELD

The present invention relates to a display apparatus using an organic EL (an abbreviation of Electro Luminescence, hereinafter abbreviated as "EL") device, that is, an organic light emitting device.

BACKGROUND ART

The development of EL devices each using a thin film formed of a luminous material has been advanced in recent years. In particular, research on, and the development of, an organic EL device have been vigorously advanced because of the potential of the device to serve as a light emitting device having high-speed responsiveness and high efficiency. In general, an organic EL device, that is, an organic light emitting device has such a structure that an anode and a cathode are formed as a pair of electrodes on a substrate, and plural organic compound layers including a light emitting layer are laminated between the pair of electrodes by employing, for example, a vapor deposition method.

A hole transporting layer and a hole injecting layer on an anode side with respect to the light emitting layer, and an electron transporting layer and an electron injecting layer on a cathode side with respect to the light emitting layer are appropriately provided as an organic compound layer.

In addition, at least one electrode of the anode and the cathode must be a light transmission electrode (transparent electrode) in order that light emitted from the light emitting layer may be extracted. An indium tin oxide (ITO), an indium zinc oxide (IZO), or the like is used in the transparent electrode.

When a display in which a large number of organic light emitting devices are arranged is driven by using an active matrix circuit, each organic light emitting device (pixel) must be connected with a pair of thin film transistors (TFTs) for controlling a current in the pixel.

In addition, an organic light emitting device deteriorates owing to moisture, so some contrivances to protect the organic light emitting device from external moisture or oxygen are needed. For example, the organic light emitting device must be covered with a sealing film, or must be affixed with sealing glass by using a resin, to seal the device hermetically, and an inert gas such as nitrogen must be sealed in the hermetically sealed area.

Here, a conventional active matrix type display apparatus will be described with reference to FIGS. 9 and 10.

A display pixel is established by laminating and forming a TFT and an organic light emitting device on a glass substrate 500. To be specific, a TFT 501 for driving the organic light emitting device is formed on the substrate 500. The TFT 501 is covered with an inorganic insulating layer 517, and is further covered with a planarizing layer 518 for planarizing the surface of the substrate. A reflecting electrode 520 is formed on the resultant.

The reflecting electrode 520 is patterned for each pixel, and the reflecting electrode 520 and the drain electrode of the TFT 501 are electrically connected to each other through a contact hole formed in each of the inorganic insulating layer 517 and the planarizing layer 518.

A device isolation film 530 is an insulating layer provided between adjacent pixels, and is placed so as to cover an edge portion of the reflecting electrode 520.

A hole transporting layer 523, a light emitting layer 522, and an electron transporting layer 524 are formed as an organic compound layer including a light emitting layer on the reflecting electrode (first electrode) 520 as an anode. Then, a transparent electrode (second electrode) 521 as a cathode is formed, whereby an organic light emitting device is completed (see FIG. 10).

A sealing substrate 540 is stuck to the substrate 500 by using an adhesive member 541 in order that the organic light emitting device having the above constitution may be protected from moisture.

The organic light emitting device deteriorates owing to the infiltration of not only moisture from the outside but also moisture taken in at the time of the formation of a TFT or of an electrode and present in an area surrounded by the substrate and a sealing film or sealing glass into the organic light emitting device. A source of moisture present in such area is, for example, the planarizing layer provided for planarizing the substrate and formed of an insulating resin such as a polyimide-based resin or an acrylic resin.

The planarizing layer not only discharges moisture but also serves as a path through which moisture infiltrating from the outside is propagated to infiltrate into the organic light emitting device. In view of the foregoing, attempts have been made to prevent the infiltration of moisture into the organic light emitting device by: separating the planarizing layer with a planarizing layer dividing portion provided outside a pixel area; and covering the separated portion with an electrode material to trap moisture in the planarizing layer (see Japanese Patent Application Laid-Open Nos. 2004-335267, 2005-164818 and 2006-58751).

In addition, when the organic compound layer of which the organic light emitting device is formed are formed in a continuous manner to straddle organic light emitting devices, not only the planarizing layer but also the organic compound layer itself serve as paths through which moisture infiltrating from the outside is propagated.

In a display apparatus having plural pixels, a nondisplay device (dummy pixel) is formed for securing the accuracy of a repeating pattern needed in an image forming step.

Nondisplay devices are each formed in the same manner as in a pixel in a display area, and are arrayed at the same interval as that of the pixels in the display area. However, the nondisplay devices are formed outside the display area, and are not actually driven.

In each of Japanese Patent Application Laid-Open Nos. 2004-335267, 2005-164818 and 2006-58751, a planarizing layer dividing portion is present at a boundary portion between the inside of a display area and the outside of the display area, or is present outside the display area so that the area of a peripheral part not used for display is increased. In addition, the area of a peripheral part is increased similarly in a nondisplay device.

Meanwhile, in a final product such as a mobile phone or a digital camera on which a display apparatus may be mounted, there has been a growing trend toward the implementation of pixels at a high density. Accordingly, in the display apparatus, a reduction in area of a peripheral part (frame) where no image is displayed in accordance with the size of the display apparatus has been requested. However, in a display apparatus of each of Japanese Patent Application Laid-Open Nos. 2004-335267, 2005-164818 and 2006-58751, the area of a peripheral part is increased, with the result that a frame area increases.

DISCLOSURE OF THE INVENTION

The present invention provides a display apparatus with a narrow frame while having a structure in which an organic light emitting device is protected from moisture generated from a planarizing layer or infiltrating into the organic light emitting device through the planarizing layer or an organic compound layer of which the organic light emitting device is formed.

To solve the above-mentioned problems of the background art, according to one aspect of the present invention, there is provided a display apparatus including:

a substrate;

plural thin film transistors formed on the substrate;

a planarizing layer covering the plural thin film transistors;

plural organic light emitting devices formed on the planarizing layer, the organic light emitting devices each having a first electrode, an organic compound layer, and a second electrode on the substrate in a stated order, and the plural organic light emitting devices forming a display area; and plural non-light emitting devices formed on the planarizing layer outside the display area, the plural non-light emitting devices each having a discontinuous part of the planarizing layer formed in the device.

According to another aspect of the present invention, there is provided a display apparatus including:

a substrate;

plural thin film transistors formed on the substrate;

a planarizing layer covering the plural thin film transistors;

plural organic light emitting devices formed on the planarizing layer, the organic light emitting devices each having, on the substrate, a first electrode patterned for each of the organic light emitting devices, an organic compound layer formed on the first electrode in a continuous manner to straddle the organic light emitting devices, and a second electrode formed on the organic compound layer in a continuous manner to straddle the organic light emitting devices, and the plural organic light emitting devices forming a display area; and plural non-light emitting devices formed on the planarizing layer outside the display area, the non-light emitting devices each having, on the substrate, a patterned third electrode and the second electrode extending from the display area, in which a film formation edge of the organic compound layer is closer to the display area than each of the non-light emitting devices, and, in each of the non-light emitting devices, the third electrode and the second electrode are in contact with each other.

In the present invention, the discontinuous part of the planarizing layer serving as the generation source of moisture and a path through which moisture is infiltrated into each organic light emitting device is formed in a nondisplay device provided outside the outermost pixel of the display area. Alternatively, the film formation edge of organic compound layer serving as a path through which moisture is infiltrated into each organic light emitting device is closer to the display area than each nondisplay device, and a pair of electrodes is in contact in each nondisplay device. As a result, the flow of moisture infiltrating into each organic light emitting device through the planarizing layer or the organic compound layer can be shielded. Further, the formation of the discontinuous part of the planarizing layer in each nondisplay device can narrow a nondisplay area (frame), whereby a display apparatus which has a narrow frame and suppresses deterioration owing to moisture can be provided.

Further features of the present invention will become apparent from the following description of exemplary embodiments with reference to the attached drawings.

BEST MODE FOR CARRYING OUT THE INVENTION

Hereinafter, the best mode for carrying out the present invention will be described with reference to the figures. However, the present invention is not limited to the best mode.

First Embodiment

Figure 1:
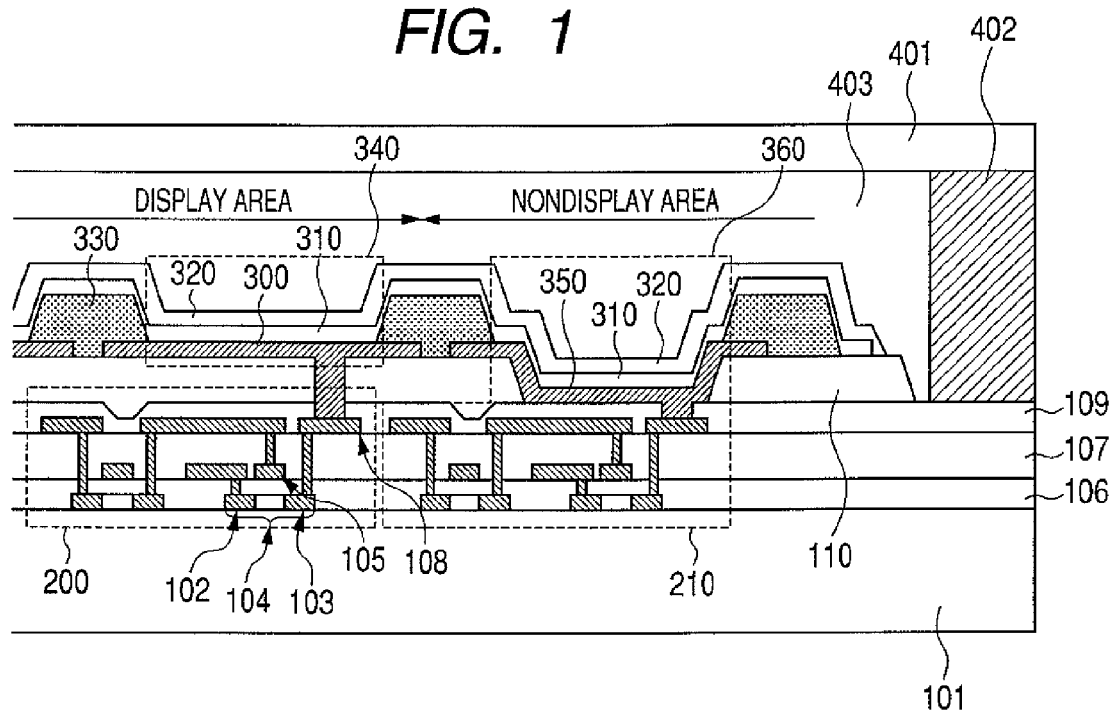
FIG. 1 is a schematic sectional view showing the section of a display apparatus according to first embodiment of the present invention.

FIG. 1 is a schematic sectional view showing a display apparatus according to first embodiment of the present invention. In FIG. 1, reference numeral 101 represents a substrate; 102, a source region; 103, a drain region; 104, an active layer; 105, a gate electrode; 106, a gate insulating film; 107, an interlayer insulating film; 108, a drain electrode; 109, an inorganic insulating film; and 110, a planarizing layer. In addition, reference numerals 200 and 210 each represent a thin film transistor (TFT); 300, a first electrode; 310, an organic compound layer; 320, a second electrode; 330, a device isolation film; 340, an organic light emitting device; 350, a third electrode; and 360, a nondisplay device. Reference numeral 401 represents a sealing substrate; 402, an adhesive member; and 403, a gap.

The display apparatus according to this embodiment has: the substrate 101; the plural TFTs 200 and 201 formed on the substrate; the planarizing layer 110 covering the plural TFTs; and the plural organic light emitting devices 340 formed on the planarizing layer to form a display area. The display apparatus has the plural nondisplay devices (dummy pixels) 360 formed on the planarizing layer 110 outside the display area.

An organic light emitting device is a device that contributes to display. Each organic light emitting device is formed of the first electrode 300, the organic compound layer 310, and the second electrode 320. A nondisplay device is a device that does not contribute to display. Each nondisplay device may have the same layer constitution as that of each organic light emitting device, or may have a layer constitution different from that of each organic light emitting device. In this embodiment, the nondisplay devices 360 each have the same layer constitution as that of each organic light emitting device because the nondisplay devices are each formed of the third electrode 350, the organic compound layer 310, and the second electrode 320. The term "different layer constitution" refers to, for example, a constitution in which the third electrode formed in the same manner as in the first electrode 300 is absent, a constitution in which the second electrode is absent, or a constitution in which the organic compound layer 310 are absent. In addition, each nondisplay device may be caused to emit light, or may not be caused to emit light. When each nondisplay device is caused to emit light, a light shielding member is preferably provided on a light extraction side in order that the device may not be used as a display pixel.

The display apparatus is established by laminating and forming the TFTs 200 and 210, the organic light emitting devices 350, and the nondisplay devices 360 on the substrate 101 formed of glass. The substrate 101 may be transparent, or may be opaque. The substrate may be an insulating substrate formed of a synthetic resin or the like, or may be a conductive substrate or semiconductor substrate having an insulating film formed of silicon oxide, silicon nitride, or the like formed on its surface.

The TFT 200 for driving each of the organic light emitting devices 340 is formed on the substrate 101. The active layer 104 formed of polysilicon of which the TFT 200 is formed is not limited to polysilicon, and amorphous silicon, microcrystalline silicon, or the like may be used in the layer. The TFT 200 is covered with the inorganic insulating film 109 formed of silicon nitride, and is further covered with the planarizing layer 110 formed of an acrylic resin for planarizing the surface of the substrate. The inorganic insulating film 109 may be an inorganic insulating film formed of silicon oxynitride, silicon oxide, or the like. The planarizing layer 110 may be formed of a polyimide-based resin, a norbornene-based resin, a fluorine-based resin, or the like.

The TFT 210 is formed below each of the nondisplay devices 360; the TFT 210 may not be formed. The case where the TFT 210 is formed is an additionally preferable constitution because the continuity of the pattern formation of the TFT 200 formed in the display area can be maintained. It is preferable that the TFTs be periodically formed over the range from the lower portions of the organic light emitting devices to the lower portions of the non-light emitting devices for maintaining the continuity. In this case, the TFT 210 formed below each of the nondisplay devices 360 preferably has the same layer constitution as that of the TFT 200 formed below each of the organic light emitting devices, and the form and composition of each layer of the TFT 210 are also preferably the same as those of each layer of the TFT 200.

In FIG. 1, the third electrode 350 and the TFT 210 are electrically connected to each other through a contact hole provided for the planarizing layer 110; the contact hole may not be provided, and the electrode and the TFT may not be electrically connected to each other. When both the electrode and the TFT are electrically connected to each other, but none of the nondisplay devices is caused to emit light, no display signal is preferably supplied to the TFT 200 of each of the dummy pixel portions.

Figure 2:
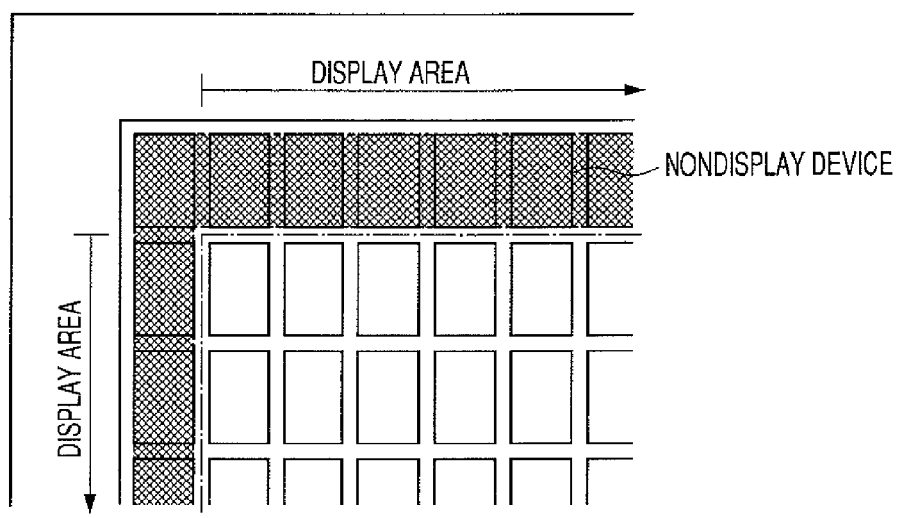
FIG. 2 is a schematic plan view showing the planar structure of the display apparatus of FIG. 1.
Figure 3:
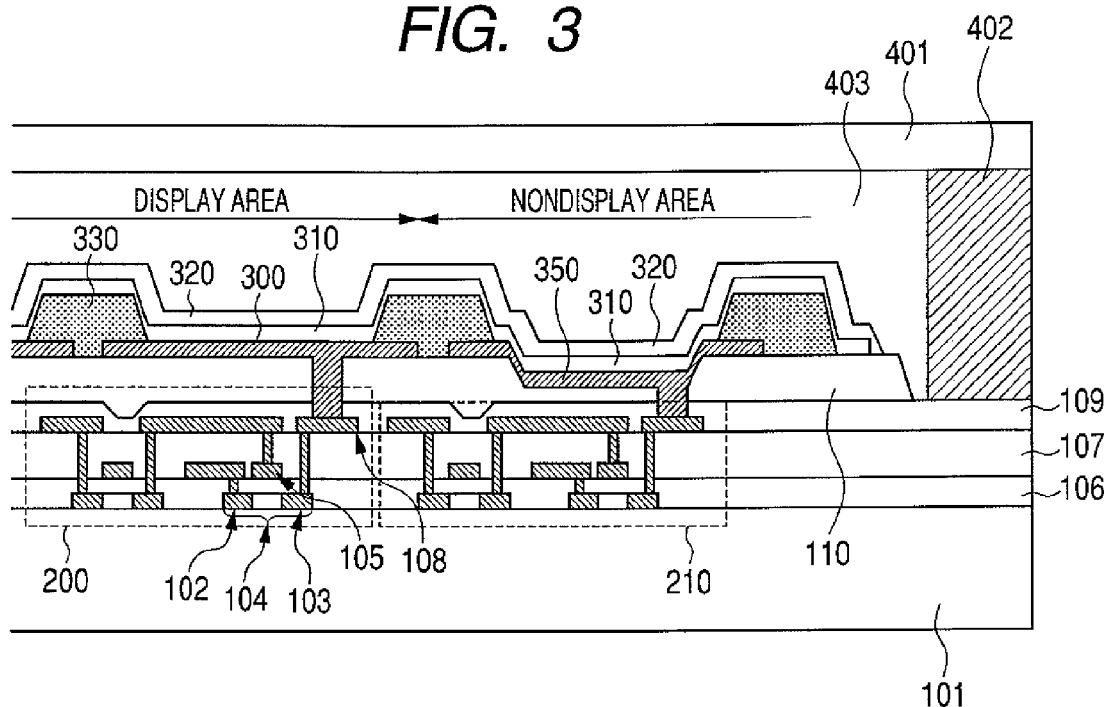
FIG. 3 is a schematic sectional view showing another sectional constitution according to first embodiment.

The planarizing layer 110 has a discontinuous part in each of the plural nondisplay devices 360 (see FIG. 2) which are formed on the outer periphery of the display area and which do not contribute to display. In other words, intrinsically, a device on an outer peripheral part is not used for display, and is defined as a nondisplay device because the continuity of a repeating pattern needed upon formation of a TFT, and an electrode and an organic compound layer to be formed on the TFT is not maintained. The discontinuous part of the planarizing layer 110 is formed in the nondisplay device. In the discontinuous part, moisture present in the planarizing layer 110, or moisture that propagates through the planarizing layer to infiltrate from the outside can be prevented from propagating through the display area. Further, the formation of the discontinuous part in the nondisplay device can narrow the width of an area (frame area) around the display area. The discontinuous part has only to be structured so as to prevent the propagation of moisture. The discontinuous part may be a portion where the planarizing layer is not formed (FIG. 2). Alternatively, the thickness of the planarizing layer at the discontinuous part may be smaller than that at any other portion (FIG. 3). The case where the planarizing layer is not formed in the discontinuous part has an additionally large preventing effect on the propagation of moisture.

Figure 4:
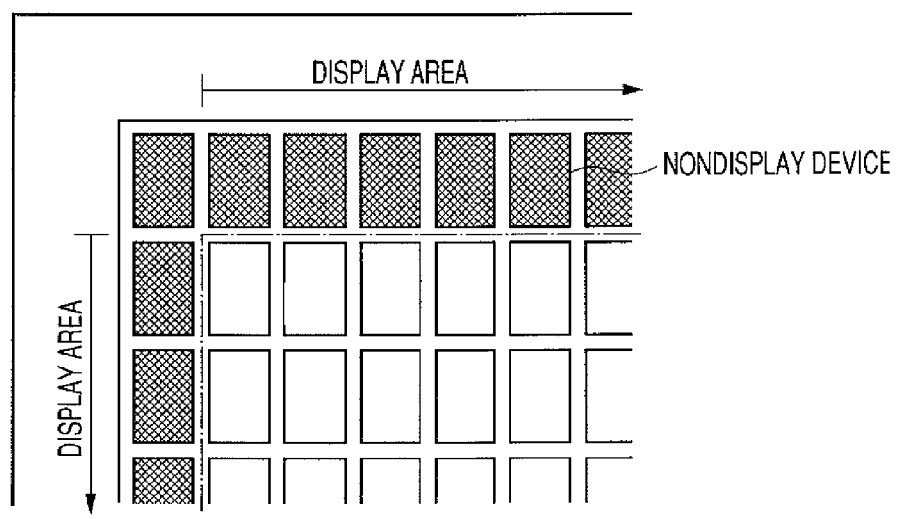
FIG. 4 is a schematic plan view showing another planar constitution according to first embodiment.

In addition, the discontinuous part may be formed in each nondisplay device as shown in FIG. 4; the discontinuous part is preferably formed in a continuous manner to straddle plural nondisplay devices like FIG. 2 instead of being merely formed in each nondisplay device. In general, nondisplay devices occupy a large part of a nondisplay area, so the formation of the discontinuous part of a planarizing layer in each of the nondisplay devices can exert a preventing effect on the propagation of moisture; such formation of the discontinuous part that the portion straddles plural nondisplay devices can exert an additional effect.

Further, the discontinuous part of the planarizing layer preferably surrounds the outer periphery of the display area. Providing at least one side of the display area with the discontinuous part of the planarizing layer can exert a preventing effect on the propagation of moisture in the side; providing each of all sides of the display area with the discontinuous part can exert an effect on each of all the peripheral sides, whereby high-quality display can be performed over an additionally long time period.

The first electrode (reflecting electrode) 300 is formed on the planarizing layer 110 in the display area, while the electrode is formed on the inorganic insulating film 109 in the nondisplay area. The first electrode 300 is patterned for each organic light emitting device, and the first electrode 300 and the drain electrode 108 of the TFT 200 are electrically connected to each other through a contact hole formed in each of the inorganic insulating film 109 and the planarizing layer 110.

Chromium is used in the first electrode 300; a silver film, a silver film containing an additive, an aluminum film, an aluminum film containing an additive, or an aluminum alloy film may be used as the electrode. In addition, an electrode having a high work function such as an oxide transparent conductive film formed of an indium tin oxide (ITO) or an indium zinc oxide (IZO) may be further formed on the first electrode 300 in order that the property with which a carrier is injected into an organic compound layer may be improved. In addition, the first electrode may be a transparent electrode, and a reflecting member may be provided between the second electrode and the planarizing layer.

The device isolation film 330 is an insulating film provided between adjacent organic light emitting devices and around an organic light emitting device, and is placed so as to cover an edge portion of the first electrode 300. An inorganic insulating film formed of, for example, silicon nitride, silicon oxynitride, or silicon oxide is desirably used in the device isolation film 330. An acrylic resin, a polyimide-based resin, a novolac-based resin, or the like is also desirably used in the film.

The organic compound layer 310 including a light emitting layer, and the second electrode (transparent electrode) 320 serving as a cathode are formed in the stated order on the first electrode 300 serving as an anode. The second electrode is an electrode formed in a continuous manner to straddle organic light emitting devices. The anode and the cathode may be inverted: the first electrode may serve as a cathode, and the second electrode may serve as an anode.

Figure 5:
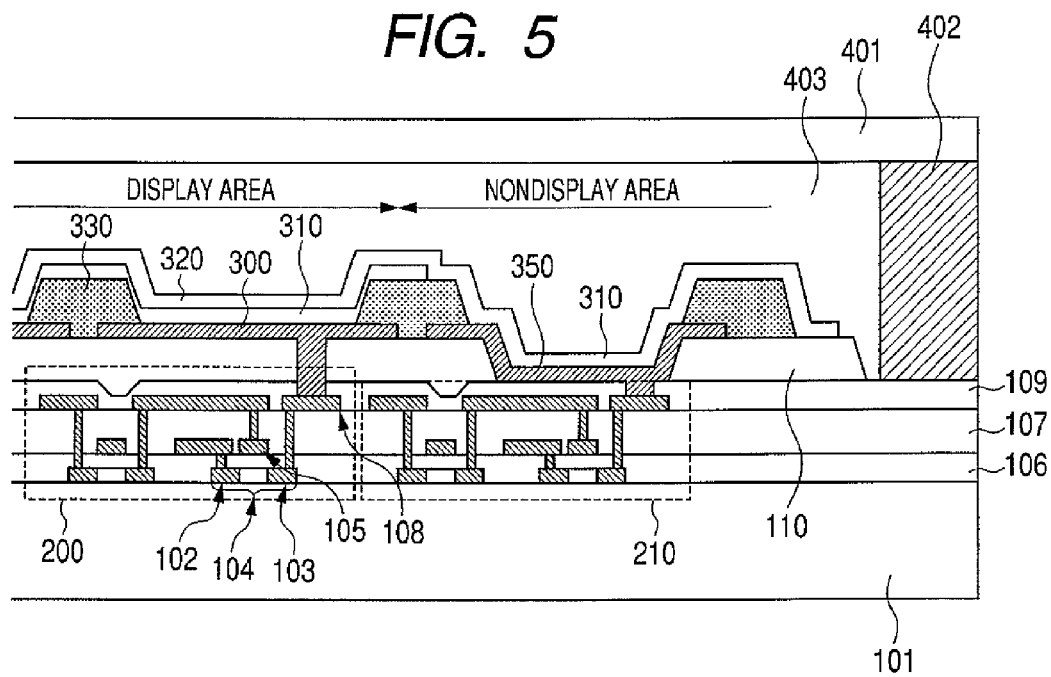
FIG. 5 is a schematic sectional view showing another sectional constitution according to first embodiment.

The organic compound layer 310 including a light emitting layer are formed of, for example, three layers: a hole transporting layer, the light emitting layer, and an electron transporting layer. Only the light emitting layer may be used, or the organic compound layer may be formed of plural layers such as two layers or four layers. When any one layer of the organic compound layer 310 is a layer to be commonly used by plural organic light emitting devices, such formation that the layer is continuous to straddle the plural organic light emitting devices can simplify the production of the display apparatus; provided that, in this case, the film formation edge of the organic compound layer is preferably closer to the display area than each nondisplay device because the organic compound layer also serves as a layer through which moisture propagates as in the case of FIG. 5. With such constitution, one path through which moisture propagates from a non-light emitting device to an organic light emitting device can be blocked. Further, in this case, when each nondisplay device has the third electrode 350 and the second electrode 320, the device is of such a constitution that the third electrode and the second electrode are in contact with each other. Since each of the third electrode and the second electrode is formed of an inorganic material, and the electrodes are tightly in contact with each other, the propagation of moisture through an interface between the organic compound layer can be effectively prevented.

Figure 6:
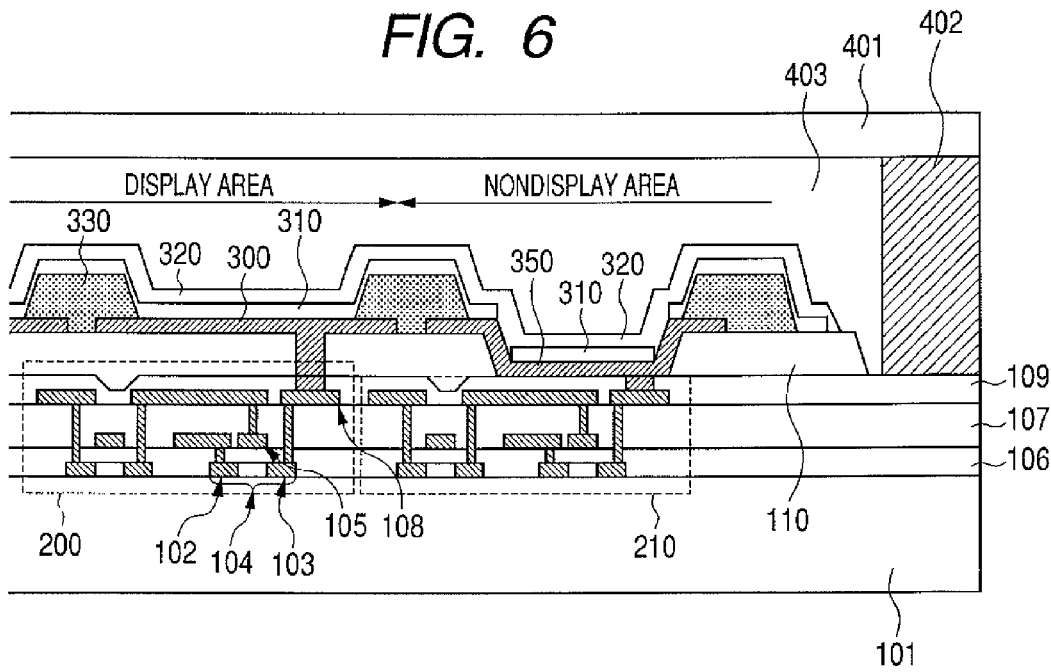
FIG. 6 is a schematic sectional view showing another sectional constitution according to first embodiment.

In addition, the organic compound layer preferably extends from the display area to a nondisplay device because the tolerance of alignment accuracy upon film formation expands. Even when the organic compound layer extends from the display area to the nondisplay device, the propagation of moisture through the organic compound layer can be prevented as long as the discontinuous part of the planarizing layer has a step height of 1 μm or more. The thickness of the organic compound layer is extremely thin, specifically, several tens of nanometers to several hundreds of nanometers, and the layers become additionally thin, or are separated at a step portion (FIG. 6). As a result, the propagation of moisture becomes difficult, whereby the infiltration of moisture into the display area can be prevented. When the organic compound layer are formed by a film formation method having high linear film formability such as a vapor deposition method, film formation at a step portion becomes difficult, whereby a preventing effect on the propagation of moisture is additionally improved.

For example, electron donative FL03 is used in the hole transporting layer. Any other material may also be used.

The light emitting layer of which the organic compound layer 310 are formed is separately colored by a metal mask, and is provided for each luminescent color. Examples of a material to be used in the light emitting layer are as follows: CBP doped with Ir(piq)$_3$ is used in a red light emitting layer, Alq$_3$ doped with coumarin is used in a green light emitting layer, and B-Alq$_3$ doped with perylene is used in a blue light emitting layer. Any other material may also be used. By the way, the following formulae show the molecular structure of a material of which the organic compound layer 310 is formed.

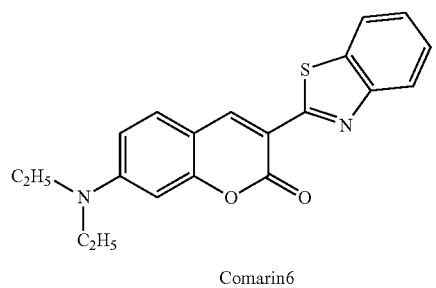

Comarin6

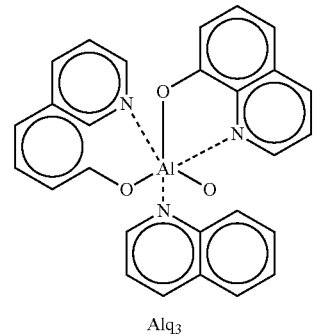

Alq$_3$

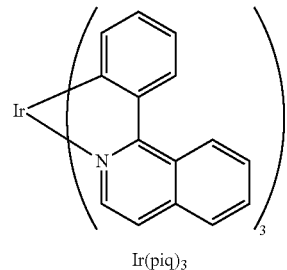

Ir(piq)$_3$

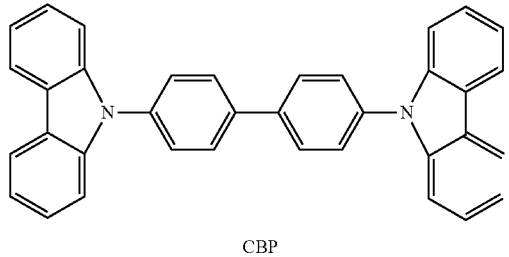

CBP

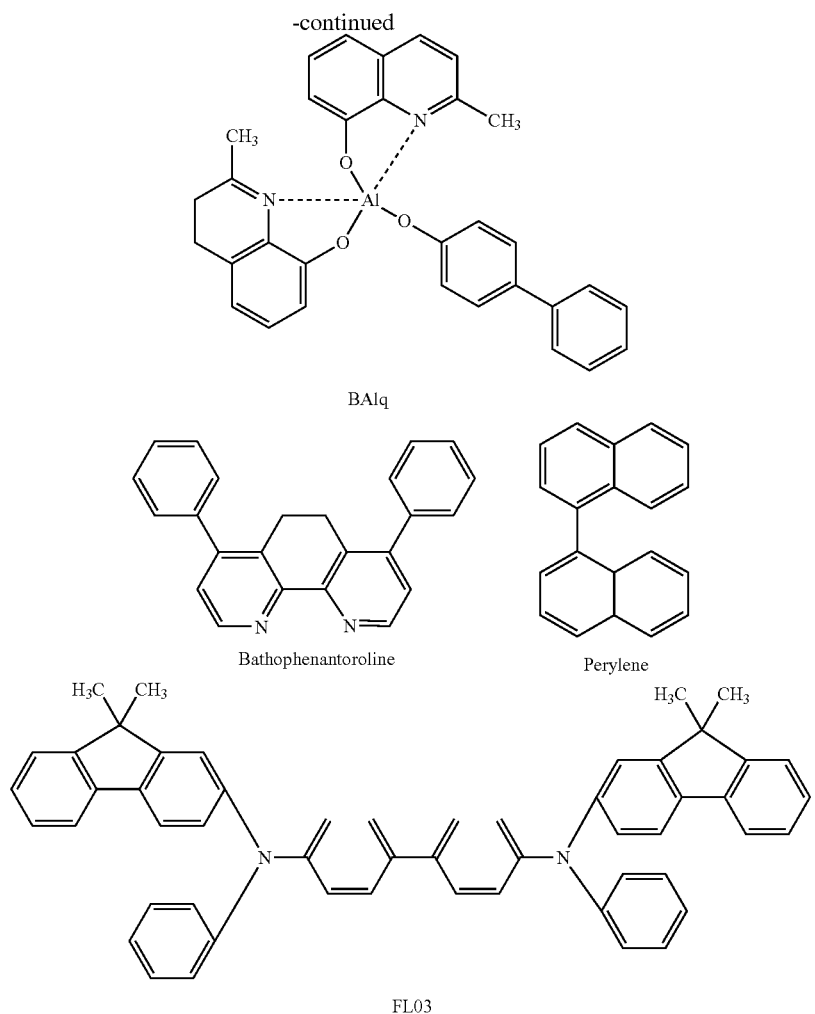

For example, bathophenanthroline having electron acceptability is used in the electron transporting layer. Any other material may also be used.

The second electrode (transparent electrode) 320 serving as a cathode is formed on the organic compound layer 310, whereby the respective organic light emitting devices are formed in the display area. An indium zinc oxide (IZO) is used in the transparent electrode 320; an oxide transparent conductive film formed of an indium tin oxide (ITO) or the like, or a metal semi-permeable film formed of silver, aluminum, gold, or the like may also be used.

As described above, the first electrode 300, the organic compound layer 310, and the second electrode 320 are laminated even in a nondisplay device. Such laminated structure can secure the continuity of patterning. It should be noted that the manner in which the second electrode is laminated is not limited to that described above, and a laminated structure in which the first electrode 300 is not formed, or a laminated structure in which the organic compound layer 310 are not formed is also permitted. A laminated structure in which the organic compound layer 310 are not formed in a nondisplay device is convenient because the infiltration of moisture from the outside of the display area through the organic compound layer 310 can be prevented.

After the formation of the organic compound layer 310, the glass substrate 401 is stuck to the substrate with a UV curable epoxy resin as the adhesive member 402 in order that the deterioration of an organic light emitting device due to moisture from the outside may be prevented. A space in the glass substrate 401, that is, the gap 403 is filled with dry nitrogen. This sealing operation is performed in a nitrogen atmosphere having a dew point of −60° C. or lower. By the way, a moisture absorbing film formed of, for example, strontium oxide or calcium oxide is more preferably formed on the organic light emitting device side of the glass substrate 401.

In addition, in this embodiment, the sealing is performed with the glass substrate 401; the sealing may be performed with an inorganic insulating film formed of, for example, silicon nitride, silicon oxynitride, or silicon oxide.

The display apparatus according to the present invention has the discontinuous part of the planarizing layer 110, which serves as the generation source of moisture and a path through which moisture is infiltrated into an organic light emitting device, formed in a nondisplay device provided outside the outermost pixel of the display area. As a result, the flow of moisture infiltrating into the organic light emitting device through the planarizing layer 110 can be shielded. In addition, the utilization of the nondisplay device can narrow the non-display area (frame), whereby a display apparatus which has a narrow frame and suppresses deterioration owing to moisture can be provided.

The display apparatus according to the present invention is applicable to the display portion of any one of various electrical appliances. For example, the display apparatus is applicable to the electronic view finder portion of a digital camera or to a lighting apparatus.

Figure 7:
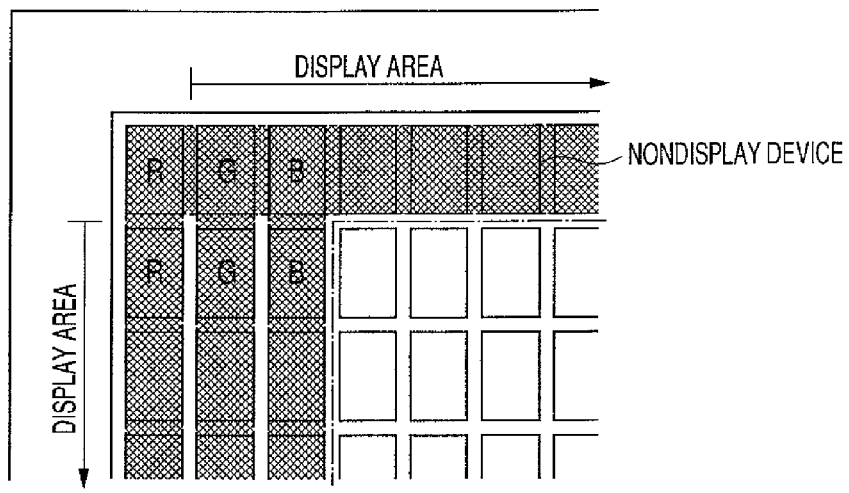
FIG. 7 is a schematic plan view showing another planar constitution according to first embodiment.

In a display apparatus shown in FIG. 2, a nondisplay device corresponding to one pixel is provided for the outer periphery of a display area; nondisplay devices corresponding to plural pixels may be provided. For example, in the case of a display apparatus formed of R, G, and B pixels, a nondisplay device is provided for each of R, G, and B colors in some cases. In such cases, three dummy pixels are provided (FIG. 7). Then, when dummy pixels corresponding to plural pixels are provided as described above, a moisture shielding structure (the discontinuous part of a planarizing layer) may be provided for the area of any one of the pixels, or plural moisture shielding structures may be provided for the areas of all pixels.

Second Embodiment

Figure 8:
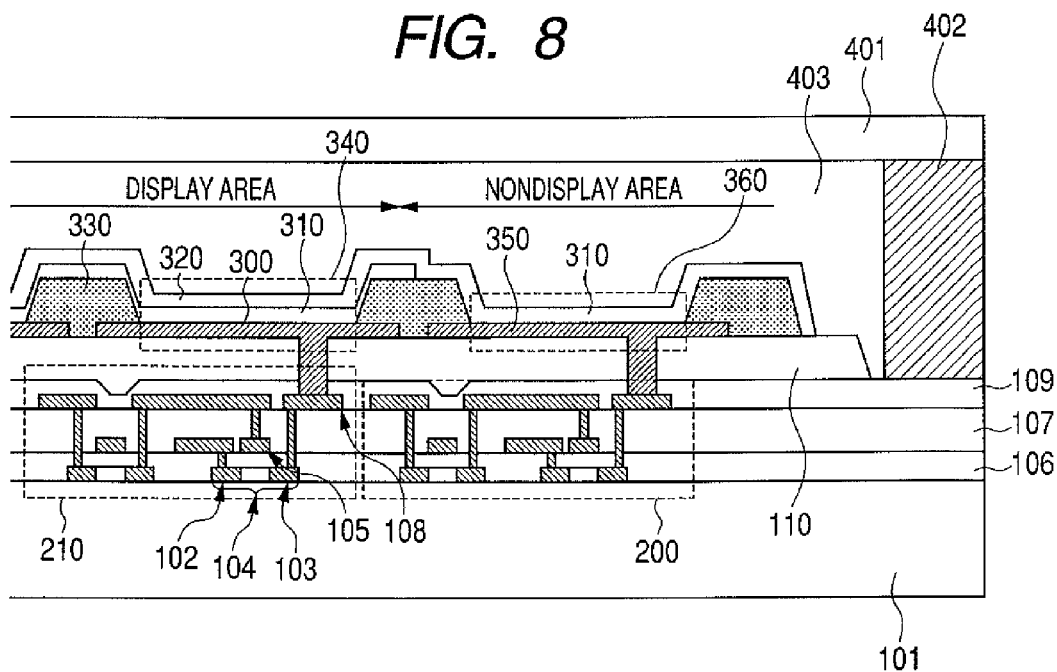
FIG. 8 is a schematic sectional view showing the section of a display apparatus according to second embodiment of the present invention.
Figure 9:
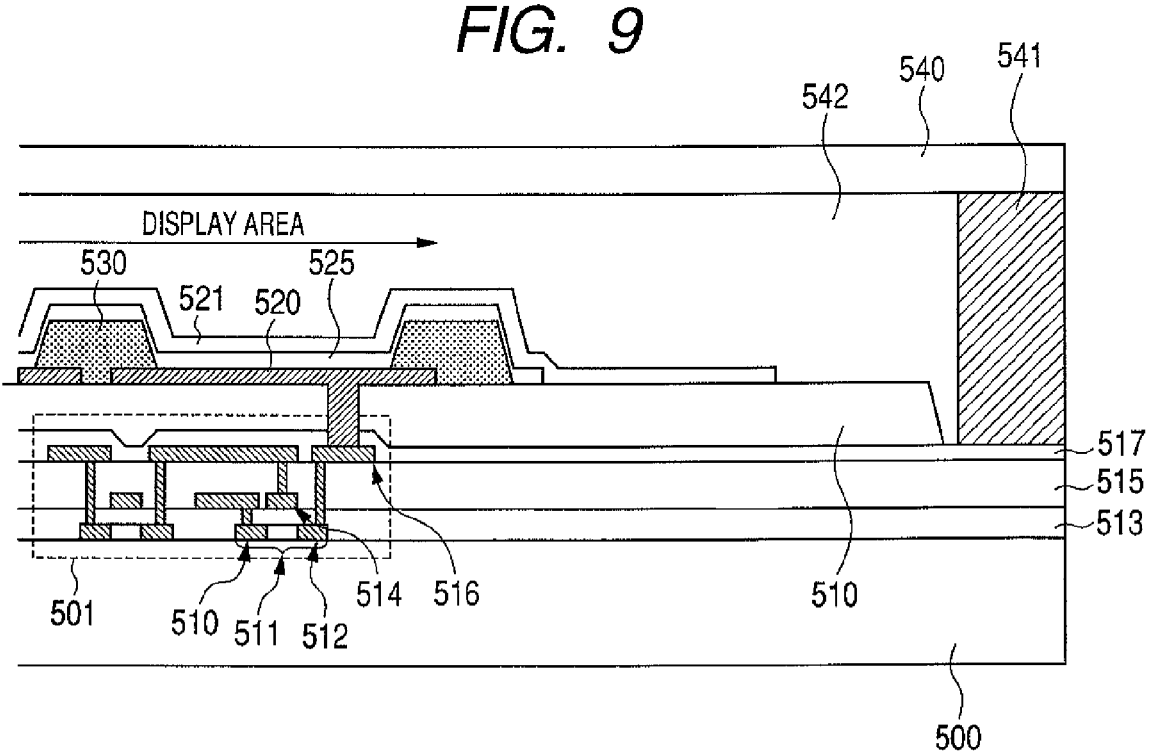
FIG. 9 is a schematic view showing the section of a conventional active matrix type display apparatus.
Figure 10:
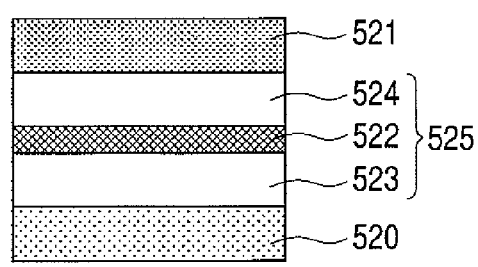
FIG. 10 is a schematic view showing the section of an organic compound layer.

FIG. 8 is a schematic sectional view showing a display apparatus according to second embodiment of the present invention. Hereinafter, the description of the same constitution as that of first embodiment will be omitted.

The display apparatus according to this embodiment has: the substrate 101; the plural TFTs 200 and 201 formed on the substrate 101; the planarizing layer 110 covering the plural TFTs; and the plural organic light emitting devices 340 formed on the planarizing layer to form a display area. The display apparatus has the plural nondisplay devices (dummy pixels) 360 formed on the planarizing layer 110 outside the display area.

Each of the organic light emitting devices 340 has, on the substrate 101, the first electrode 300 patterned for each organic light emitting device, the organic compound layer 310 formed in a continuous manner to straddle organic light emitting devices, and the second electrode in the stated order.

Each of the nondisplay devices 360 has, on the substrate 101, the patterned third electrode 350 and the second electrode 320 extending from the display area in the stated order.

The film formation edge of the organic compound layer 310 is closer to the display area than each of the nondisplay devices 360, and, in each of the non-light emitting devices 360, the third electrode 350 and the second electrode 320 are in contact with each other. Such constitution can block a path through which moisture propagates from each of the non-light emitting devices 360 to each of the organic light emitting devices 340. Further, each of the third electrode and the second electrode is formed of an inorganic material, and electrodes are tightly in contact with each other, so the propagation of moisture through an interface between the organic compound layer can be effectively prevented.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2006-196430, filed Jul. 19, 2006, and 2007-165844, filed Jun. 25, 2007, which are hereby incorporated by reference herein in their entirety.

The invention claimed is:

1. A display apparatus comprising:
a substrate;
plural thin film transistors formed on the substrate;
a planarizing layer covering the plural thin film transistors;
plural organic light emitting devices formed on the planarizing layer, the organic light emitting devices each having a first electrode, an organic compound layer, and a second electrode on the substrate in a stated order, and the plural organic light emitting devices forming a display area; and
plural non-light emitting devices formed on the planarizing layer outside the display area, the plural non-light emitting devices each having a discontinuous part of the planarizing layer formed in the device,
wherein the discontinuous part is formed in a continuous manner to straddle the plural non-light emitting devices.

2. The display apparatus according to claim 1, wherein the discontinuous part comprises a portion where the planarizing layer is not formed.

3. The display apparatus according to claim 1, wherein the discontinuous part surrounds an outer periphery of the display area.

4. The display apparatus according to claim 1, wherein:
the plural non-light emitting devices each have a third electrode formed on the substrate and the second electrode extending from the display area; and
a film formation edge of the organic compound layer is closer to the display area than each of the non-light emitting devices, and, in each of the non-light emitting devices, the third electrode and the second electrode are in contact with each other.

5. The display apparatus according to claim 1, wherein:
the plural non-light emitting devices each have a third electrode formed on the substrate, and the organic compound layer and the second electrode extending from the display area; and
the discontinuous part of the planarizing layer has a step height of 1 μm or more.

6. The display apparatus according to claim 1, wherein the thin film transistors are formed over a range from lower portions of the organic light emitting devices to lower portions of the non-light emitting devices.

7. A display apparatus comprising:
a substrate;
plural thin film transistors formed on the substrate;
a planarizing layer covering the plural thin film transistors;
plural organic light emitting devices formed on the planarizing layer, the organic light emitting devices each having a first electrode, an organic compound layer, and a second electrode on the substrate in a stated order, and the plural organic light emitting devices forming a display area; and
plural non-light emitting devices formed on the planarizing layer outside the display area, the plural non-light emitting devices each having a discontinuous part of the planarizing layer formed in the device,
wherein the discontinuous part comprises a portion at which a thickness of the planarizing layer is smaller than the thickness of the planarizing layer at any other portion.

8. The display apparatus according to claim 7, wherein the discontinuous part comprises a portion where the planarizing layer is not formed.

9. The display apparatus according to claim 7, wherein the discontinuous part surrounds an outer periphery of the display area.

10. The display apparatus according to claim 7, wherein:
the plural non-light emitting devices each have a third electrode formed on the substrate and the second electrode extending from the display area; and
a film formation edge of the organic compound layer is closer to the display area than each of the non-light emitting devices, and, in each of the non-light emitting devices, the third electrode and the second electrode are in contact with each other.

11. The display apparatus according to claim 7, wherein:
the plural non-light emitting devices each have a third electrode formed on the substrate, and the organic compound layer and the second electrode extending from the display area; and
the discontinuous part of the planarizing layer has a step height of 1 μm or more.

12. The display apparatus according to claim 7, wherein the transistors are formed over a range from lower portions of the organic light emitting devices to lower portions of the non-light emitting devices.

* * * * *